US009869982B1

(12) United States Patent
Clidaras et al.

(10) Patent No.: US 9,869,982 B1
(45) Date of Patent: Jan. 16, 2018

(54) DATA CENTER SCALE UTILITY POOL AND CONTROL PLATFORM

(71) Applicant: Google Inc., Mountain View, CA (US)

(72) Inventors: Jimmy Clidaras, Los Altos, CA (US); Anand Ramesh, Sunnyvale, CA (US); Christopher G. Malone, Mountain View, CA (US)

(73) Assignee: Google Inc., Mountain View, CA (US)

( * ) Notice: Subject to any disclaimer, the term of this patent is extended or adjusted under 35 U.S.C. 154(b) by 448 days.

(21) Appl. No.: 14/517,241

(22) Filed: Oct. 17, 2014

(51) Int. Cl.
G05D 23/00 (2006.01)
G05B 15/02 (2006.01)
G05D 23/19 (2006.01)

(52) U.S. Cl.
CPC .............. *G05B 15/02* (2013.01); *G05D 23/19* (2013.01)

(58) Field of Classification Search
CPC ................................ G05B 15/02; G05D 23/19
USPC ........................................................ 700/299
See application file for complete search history.

(56) References Cited

U.S. PATENT DOCUMENTS

| 8,526,183 | B1 | 9/2013 | Hamburgen |
| 8,601,287 | B1 | 12/2013 | Weber |
| 8,621,248 | B1 | 12/2013 | Weber |
| 8,645,722 | B1 | 2/2014 | Weber |
| 8,700,929 | B1 | 4/2014 | Weber |
| 2009/0112522 | A1* | 4/2009 | Rasmussen ............... G06F 1/26 702/186 |
| 2009/0187782 | A1* | 7/2009 | Greene ................... G06Q 10/00 713/340 |
| 2009/0210096 | A1* | 8/2009 | Stack .................... F24F 11/0009 700/278 |
| 2009/0234512 | A1* | 9/2009 | Ewing ..................... H04L 12/10 700/295 |
| 2009/0296342 | A1* | 12/2009 | Matteson ................ G06F 1/206 361/679.46 |
| 2011/0100045 | A1* | 5/2011 | Carlson .............. H05K 7/20836 62/259.2 |
| 2013/0085616 | A1* | 4/2013 | Wenzel ..................... G05F 1/66 700/278 |
| 2013/0233532 | A1* | 9/2013 | Imwalle ................... F28F 27/02 165/287 |
| 2013/0293017 | A1* | 11/2013 | Englert ..................... H02J 9/04 307/65 |
| 2014/0229765 | A1 | 8/2014 | Grimshaw |

FOREIGN PATENT DOCUMENTS

| EP | 2546771 A3 | 5/2013 |
| WO | WO2013134023 A1 | 9/2013 |
| WO | WO2013184718 A1 | 12/2013 |

* cited by examiner

*Primary Examiner* — Ziaul Karim
(74) *Attorney, Agent, or Firm* — Fish & Richardson P.C.

(57) ABSTRACT

A system for providing cooled air to electronic equipment includes a cooling system arranged to provide cooling for computer systems in a data center that generate heat from electrical usage; one or more sensors for sensing an environmental condition near the data center; and a central control system programmed to allocate future compute demand for the data center as a function of the sensed environmental condition.

23 Claims, 4 Drawing Sheets

DATA CENTER SCALE UTILITY POOL AND CONTROL PLATFORM

TECHNICAL FIELD

This document relates to systems and methods for providing cooling for areas containing electronic equipment, such as computer server racks and related equipment in computer data centers.

BACKGROUND

Economical cooling is an important aspect of modern large-scale computer data centers. Such data centers may house thousands, hundreds of thousands, or even millions of computer servers mounted in numerous rows of computer racks, and those computers may be used for a variety of computing functions. The computers use electric power to perform the computations and other related activities, and the power usage is relatively dense (megawatts of power in a single facility). As a result, the computer servers and related components generate a large amount of heat. For example, a pair of microprocessors mounted on a single motherboard can draw 200-400 watts or more of power. Multiply that figure by several thousand (or tens of thousands) to account for the many computers in a large data center, and one can readily appreciate the amount of heat that can be generated.

Thus, while the cost of generating the heat can be high for a data center, the cost of removing all of the heat can also be high. That cost typically involves the use of even more energy, in the form of electricity and natural gas, to operate chillers, condensers, pumps, fans, cooling towers, and other related components. Heat removal can also be important because, although microprocessors may not be as sensitive to heat as are people, increases in heat generally can cause great increases in microprocessor errors and failures. In sum, such a system may require electricity to run the chips, and more electricity to cool the chips.

SUMMARY

This document describes systems and methods that may be employed to remove heat efficiently from areas that host electronic equipment, such as data centers that host computer servers and related equipment. In certain implementations, the level of power delivered to computers in a data center can be adjusted based on a determined susceptibility of an area around the data center cooling equipment (e.g., air intake louvers or cooling towers) to accept the heat. For example, on warm days with high humidity, cooling towers are less effective than on cooler or drier days. While outdoor temperature might be used to adjust the operation of cooling equipment, a more direct approach of controlling the computational demand of the data center in response to such a determination may be more direct, and may be more responsive and effective.

The system for controlling power may adjust the amount of main load demanded, the amount of cooling provided (and thus cooling electrical electric load demanded), or both in combination. For example, if monitoring of ambient conditions indicates that the cooling system will not be able to provide additional cooling, the system may cut back on the volume of computing jobs that the data center is willing to accept over a coming period. Or, if monitoring of ambient conditions indicates that the cooling system will not be able to provide additional cooling, the system may allow the compute load to operate at higher than normal temperatures (e.g., allow electronic equipment in the rows 118 to operate at higher than normal temperature) for a period of time (e.g., during the higher than normal ambient conditions).

If monitoring indicates that additional cooling capacity is available (and that additional electrical capacity is available), additional cooling capacity may be added to a system, setpoints for the system may be made more aggressive (e.g., temperature setpoints for cooling may be lowered), or both. Such determinations may be made, and control changes effected, on a sub-second recurring basis. Other mechanisms may be used to temper such changes as needed so that, e.g., changes in compute supply may be made at an appropriate rate (generally very quickly) and changes in setpoints may also be made at an appropriate rate (generally less quickly), and thus do not overshoot or seek an appropriate level. Such controls may be implemented by a central control system that monitors and controls an entire electrical power infrastructure as a unitary whole.

In one implementation, the computing resources in a data center may be allocated using a central management system. Such a system may be informed of the level of incoming tasks that need to be completed by the data center (e.g., search requests, data analysis sessions, video rendering and serving, email processing, etc.) and may determine which of the resources should perform those tasks. The system may also be programmed to analyze atmospheric data for an area around the data center, such as near outdoor cooling equipment like cooling towers. The data may include temperature and humidity (e.g., by sensing wet bulb temperature) and may be taken frequently. Such data may be used to compute the amount of power needed to cool the data center at different levels of heat generation by electronics and equipment in the data center. An acceptable level may be determined, and that level may then be translated into a level of electrical use by the loads in the facility that will allow the cooling equipment to cool the data center adequately below the identified power level. Such electrical usage level may then be translated, by the central management system, into a level of acceptable compute resources that can employed during the relevant time period. The central management system may then manage the compute load so that the electrical use stays below a level that would cause the cooling load from the operating equipment to exceed the determined acceptable load.

Such power management and distribution may be controlled initially at the electrical power level and then at the compute level. In particular, an acceptable electrical power level for a data center may be determined for the current (and perhaps future) atmospheric conditions (e.g., the system can assume temperature will fall x degrees per hour in the evening based on machine learning from prior data), and those power levels may be allocated to particular servers, racks, or other segments of the data center, which segments can then tell the central management system how much compute work they are willing to accepted so as to maintain their acceptable power usage level.

Such management of electrical power in a data center can be provided more flexibly by additionally, or alternatively, providing the data center with a very large medium voltage power plane (or a small number (e.g., 1-10) of relatively large planes (e.g., 5 MW, 10 MW, 20 MW, 25 MW, or 50 MW, or any number between) across a data center). In particular, transformers and other equipment are frequently employed in a data center and block the free flow of electrical power from one area of the data center to another as it is needed, thus creating multiple separate power planes.

For example, if a MV-to-LV transformer is placed at the end of each row of racks and one row needs excess power while another has a substandard power need, the power cannot easily pass from one row to the next because its flow will be blocked by the transformers. If instead, medium voltage power is distributed broadly in a data center in a single common medium voltage power domain, and is only stepped down to low voltage power (e.g., 4160/3/60 down to 230/3/60) very close to the servers (e.g., at the top of each rack or at each server), the power can move freely throughout the medium voltage domain. As discussed here, for example, medium voltage domains of about 10, 20, 30, 50 75, and 100 MW in size, and in ranges whose endpoints are identified by any combination of two of these values, may be employed.

The details of one or more embodiments are set forth in the accompanying drawings and the description below. Other features, objects, and advantages will be apparent from the description and drawings, and from the claims.

DETAILED DESCRIPTION

Figure 1:
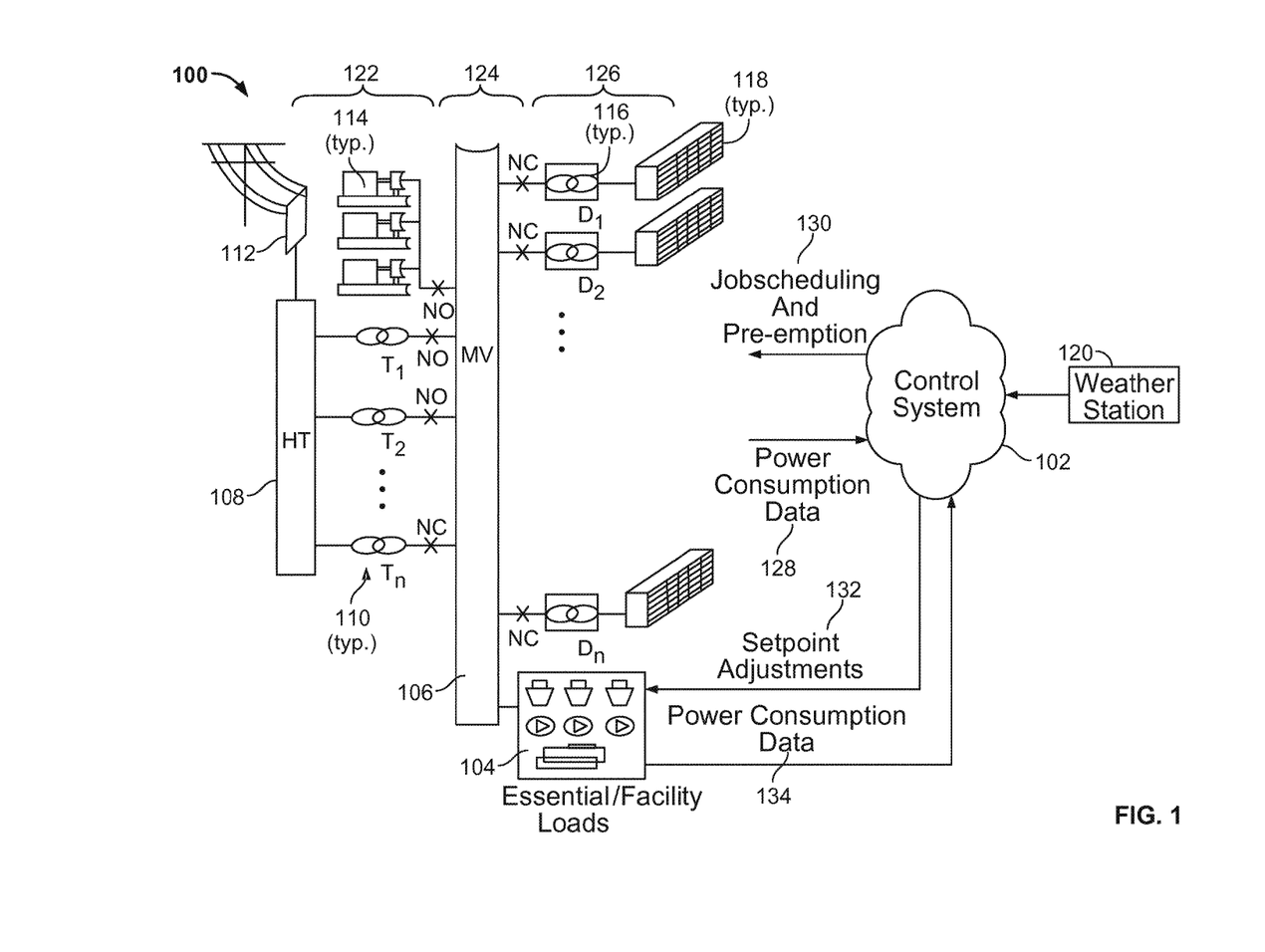
FIG. 1 is a schematic diagram of a data center power distribution architecture.

FIG. 1 is a schematic diagram of a data center power distribution architecture. In general, the figure shows, in schematic form, a power distribution system 100 for a data center, where the system 100 serves both critical loads, such as server systems, and essential loads such as other facility loads at the data center (e.g., cooling systems). The power provided and consumed by such different loads is coordinated by a central control system 102 that determines, using current ambient air conditions (e.g., via sensing wet bulb temperature) the extent to which cooling systems will be able to pick up anticipated cooling loads and the extent to which the cooling systems can be set to provide additional or less cooling. Such system 102 may also identify the expected compute load and may determine how much electrical capacity should be allocated to critical loads and how much to essential loads during a time period, and may control such sub-systems that are part of those loads in order to match the actual performance to the computed available performance so that electricity use is maximized in a system (when such is needed) without standing capacity in the system, and also without exceeding allowable capacity limits for the system.

Power enters the system 100 at high voltage, typically 100 to 300 kV, and is transformed to a medium voltage power plane typically between 10 kV and 35 kV. The power generally comes from one or more sets of HT lines and a sub-station system 112, and is provided at a high voltage plane 108, which may take a variety of forms. A number of HV-to-MV transformers 110 may then step the power down in voltage and may supply it to a common medium voltage power plane 106. In this example, a single common power plane is shown, though multiple planes may be used as needed to supply power to the data center. The data center may be rated for 100 MW of power or more, and each MV plane may be 10 MW, 20 MW, 25 MW, 30 MW, 50 MW, 75 MW, or 100 MW. Such components may define a HV domain or HV-to-MV domain 122.

Backup generators 114 may also be provided at the medium voltage plane 106 to provide additional power when utility power cannot meet needs, or replacement power when utility power fails. In some instances, the generators 114 may provide primary power, and the power grid may provide back-up power when the generators 114 fail or are otherwise unable to provide all the power required by the system 100. In this example, the medium voltage power plane 106 may be a single domain or pool of power that can flow readily throughout the domain without the presence of devices in the domain that would block such power flow. In certain examples, the single medium voltage plane 106 serves essentially all of the computer resources in a large data center, approximately ½ of the computer resources in the data center, or approximately ⅓ of the resources in the data center. In terms of megawatts, the single medium voltage power plane may be of the sizes listed above, or the ranges defined between those different sizes.

In this example, each feed to the MV plane 106 is connected via a controlled switched connection so that the system 102 may determine which sources should be provided at any time and coordinate such provision of electric power as it is needed, and according to the ability of each feed to provide it. The switches are annotated as NO for normally-open and NC for normally-closed, though other configurations may be employed also. For example, switches from the generators 114 are normally open, indicating that the generators 114 are for back-up power. Particular switches from the high voltage plane 108 may be closed as power is needed form the plane 108.

A number of medium voltage to low voltage (MV-to-LV) transformers 116 or converters are shown in servers/networking powered domains, and may be physically located close to the servers such as at or in particular rows of servers. For example, such converters 116 may be located at each rack in a row 118 of racks, and each bay in a row 118, or at each server or small set of servers in a row 118. As a result of this arrangement, the data center has a very large number of extremely small LV domains (e.g., hundreds) compared to a very small number of large MV domains (e.g., one). As a result, power can flow much more easily within and across each of the large MV domains, so that if there is a high demand in one area of a domain it can be readily met by power flowing from another part of the domain that does not have the same needs.

Separately, essential/facility loads 104 are fed power from the MV plane 106. These loads 104 include equipment such as chillers, pumps for chilled and process water, cooling towers, chillers, and ancillary equipment. In certain embodiments, they can also include power for offices that are part of the data center and for lighting in the data center computing room (or rooms) itself.

As shown in the illustrated example of FIG. 1, cooling plant power, for example power supplied to the essential/facility loads 104, is provided by the same MV plane 106 as IT loads, namely power loads to the rows 118 of racks. For example, although conventional power schemes may use dedicated power modules (e.g., power planes) for essential/facility loads 104 (e.g., sized at 1-2 MW each), such power modules might not operate at full capacity. By using a common MV plane 106 for IT and essential/facility loads, unutilized or underutilized essential/facility loads may be used for IT loads, thereby allowing, for example, additional IT loads to be scheduled (e.g., greater utilization of the compute load in the rows 118 of racks).

Further, in some aspects, one or more MV-LV transformers 116 may be positioned (e.g., electrically) between the MV plane 106 and the essential/facility loads 104, between the MV plane 106 and office or inhabitant loads, and/or between the MV plane 106 and other facility loads. For example, one or more MV-LV transformers 116 can be electrically coupled between the MV plane 106 and electrical loads that cannot accept MV, or alternatively, may more efficiently accept LV. For example, certain facility loads (e.g., chillers) may be able to accept native MV while other facility loads (e.g., fans, pumps, and otherwise), as well as office electrical loads, may only accept LV (e.g., 480 V, 230 V or otherwise).

A central control system 102 controls how much power is provided to, or taken by, each part of the system 100. The control system 102 takes into account a large number of factors and makes decisions about, for example, the operation of the cooling system in the data center, the power distribution in the data center and power use in the data center, and the allocation of computing tasks among the servers in the data center, among other things.

As shown in the figure, the central control system 102 may obtain power consumption data 128 from the electrical distribution system serving the critical loads, such as information from individual power supplies or other power distribution equipment indicating the amount of power that such equipment will need in order to serve its associated loads during a defined period of time, such as a sub-second reporting. For example, as requests to take on computing tasks arrive, particular servers, racks, rows, or other groups of computers may determine their currently-subscribed tasks and may determine whether they can complete new tasks given their current load level, their computing capabilities, and the amount of electrical consumption assigned to them. If they take on a set of tasks, they may report to the central control system 102 that they have done so, and they or the central control system 102 may compute how much electrical power that will require over the coming period.

That is repeated constantly for the critical equipment. The central control system 102 may report back to a power distribution system for the critical loads job scheduling and preemption information 130, such as indicating to different power supplies or other pieces of equipment the level of compute resources that will be demanded in its zone of influence during the next sampling period (or which the system 102 will permit such sub-portions of the system to take on), which may be substantially less than one second. In certain implementations, the central control system 102 may send similar information directly to computers in the system. Alternatively, or in addition, the data that is sent to the power supplies and other power management equipment may be managed by that equipment which may in turn send information to the computer servers to help manage their operations and their power needs. Such proactive power management may ensure that different sub-areas of the system 100 maintain a high level of demand without exceeding their allocated levels of demand, which would otherwise trip circuit breakers and cause an unnecessarily long amount of down time for that area of the system 100. The system 100, then, performs demand-side power management by causing the computing resources to take on only the level of computing tasks for which they have been allocated corresponding electrical power in the system.

The central control system 102 also receives data from a weather station 120, which may include a wet bulb thermometer near the data center, and more preferably near a location where cooling equipment for the data center will be exhausting heat into the atmosphere. For example, if the data center uses a liquid cooling system with cooling towers, the weather data may be obtained from an area near the cooling towers, or at least close enough to be in a location determined to adequately represent the conditions around the cooling equipment. In certain implementations, the weather information may be obtained from a third party source (particularly with respect to data about future weather conditions). Such data may indicate an ability of the atmosphere to accept heat from the data center, where warm humid air will not accept as much heat as will cool dry air.

The central control system 102 may use such information to change the amount of electrical power used by the compute load (e.g., the IT load of the rows 118 of racks, or the critical load) and by facility loads 104 (the essential loads), including to rebalance power use between the two such loads. With respect to the computer loads, the central control system 102 may change the job scheduling and pre-emption commands that it provides to the electrical power distribution system, so that the data center is unable to perform as high a number of computing processes when the environmental conditions indicate that cooling will be difficult, as compared to when it indicates that cooling (or more precisely, taking on additional cooling load) will be easier.

Similarly, the central control system 102 may change setpoint adjustments for the facility loads, and may monitor power consumption data by those facility loads to determine a level of change in electrical demand that such setpoint changes will create. Various different algorithms may be used to control the particular amount by which each such factor is changed in response to changes in current environmental conditions.

In certain implementations, the changes may occur on a dynamic basis. For example, if a data center is operating below its maximum electrical and cooling load, cooling resources may be added or removed simply in response to identified increases or decreases in computing load. Alternatively, or in addition, temperature setpoints may be maintained (e.g., for air or water, or both) at levels that have been determined to be best setpoint temperatures. Where limits on electrical consumption are close to being reached, the system may make decisions in real-time about whether to take on additional computing tasks, and whether, and how, to adjust electrical power delivered to a cooling system to absorb the heat created by taking on those tasks. For example, additional computing tasks may be taken on, in excess of what the currently allocated cooling resources are capable of handling, for a limited time period, which will cause operating temperatures to rise in the system 100, if it can be expected that future computing requirements will be lower so that the cooling system may return the system 100 back to appropriate operating conditions sufficiently soon.

If electrical and cooling resources are available, they may also be employed (added) to maintain the current setpoints. If the system 102 determines that additional cooling resources are not available and that acceptable operating conditions cannot be maintained (e.g., because the temperatures have already trended too high in response to taking on prior excessive computing tasks), the system 102 may force the computing resources to refuse to take on additional tasks that are in excess of those that the cooling system can absorb.

Future environmental conditions may also be taken into account in appropriate circumstances where longer-term allocation decisions may be made. For example, the central management system may contain data about trends in outdoor wet bulb temperature for the area around the data center, and those trends, when combined with weather prediction data that may be obtained from third parties, may indicate that the web bulb temperature will be falling over the next three hours by a certain amount each hour. The central control system 102 may take such information into account in setting setpoints and acceptable compute load for the data center. For example, in one implementation, the cooling load may have a discrete jump in it, such as when a data center requires the activation of a chiller or other high power-consuming device to maintain a particular setpoint. The central control system 102 may be programmed with data that indicates when such a discrete event will need to occur, and may set the compute load and corresponding setpoint to avoid turning on a chiller if the trend data indicates that the chiller will not be needed after a short period of time, because of predicted future atmospheric cooling.

Similarly, the system 102 may use data about historical computing load in order to determine whether it may subscribe to a load that exceeds the current cooling capabilities of the system 100. For example, if historical data indicates that a short-term spike or spikes in compute load occurs every workday (e.g., when workers arrive at work and check their email accounts) or when they are on their lunch breaks and watch on-line videos, the system 102 may accept such load knowing that it will drive up the operating temperatures of the system 100 by a limited amount and for a limited time, because once the short-term demand is over, the cooling system will be able to bring the temperatures back into line during a lull in demand. This may be particularly true if the wet-bulb temperature and forecast indicate that recovery of the operating temperature back to their setpoints will be relatively easily achieved.

In this manner, the system 100 shown here may coordinate the allocation of computing resources to various computer server systems in response to readings of environmental conditions around a data center in which the computer server systems are located. The system 100 may more readily respond to such environmental changes by changing its own demand for electrical power and bus its demand for cooling resources.

Figure 2:
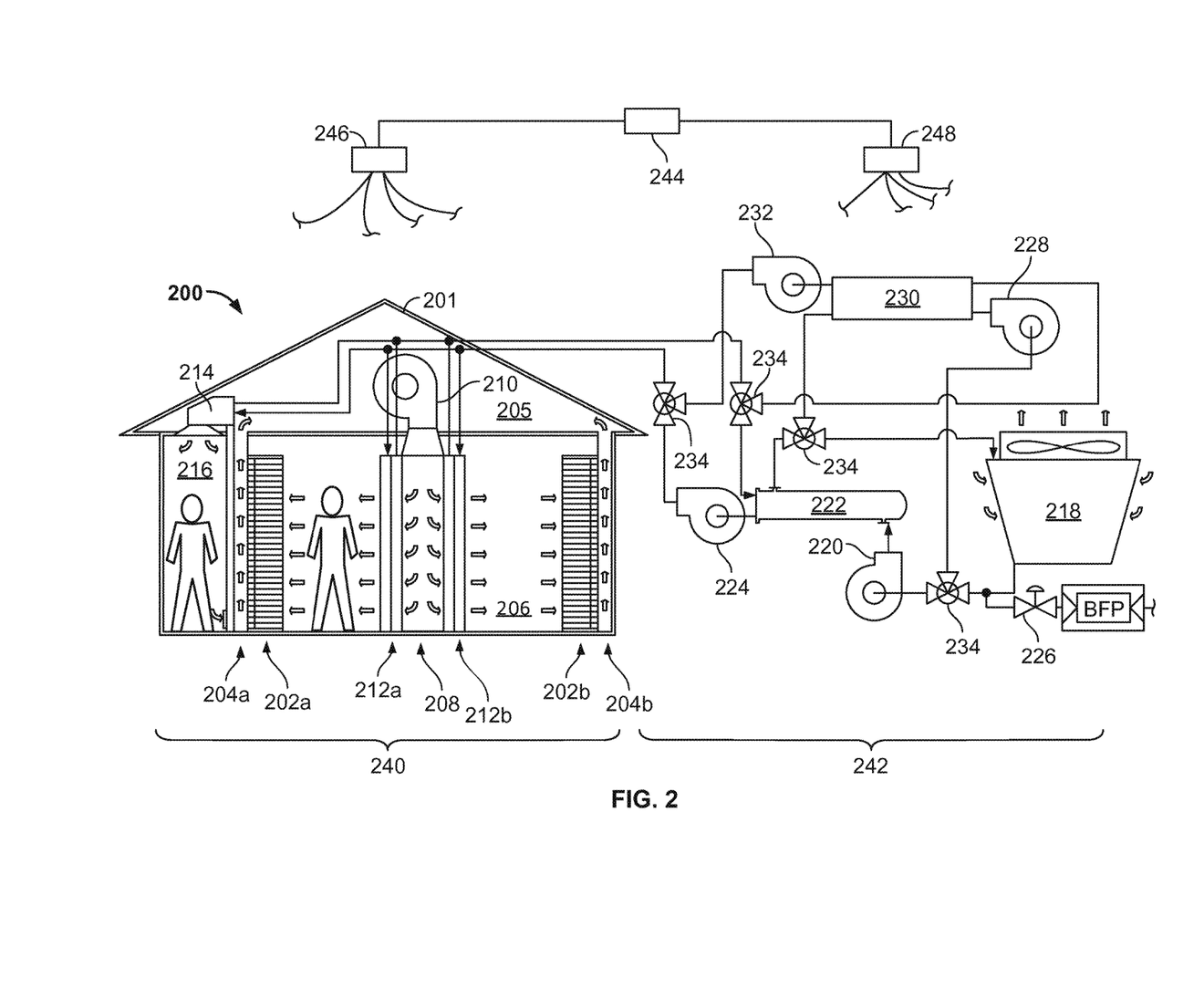
FIG. 2 is a schematic diagram of a system for cooling a computer data center and a power system for the data center.

FIG. 2 is a schematic diagram showing a system 200 for cooling a computer data center 201. The system 200 generally includes an air handling unit (including e.g., fan 210 and cooling coils 212a, 212b) in the data center 201 for transferring heat from the data center's air to cooling water, a heat exchanger 222 for removing heat from the cooling water and passing it to cooling tower water, and a cooling tower 218 to pass the accumulated heat to the ambient air through evaporation and cooling of the cooling tower water. In general operation, the system 200 may be run from the cooling tower/heat exchanger/cooling coil system, though a powered refrigeration system such as a chiller 230 may be provided for peak loads, such as when the outdoor ambient dew point is very high and the cooling tower 218 cannot provide sufficient cooling alone. As explained below, control parameters for the system 200 may also be set so as to avoid most or any need for the use of chiller 230 or other such items.

The temperatures of each portion of the system 200 are selected to be relatively high, so as to permit more efficient operation of the system 200, than if the temperatures were lower. For example, relatively high air temperatures in the system (e.g., air entering a cooling coil over 110° F. (43.3° C.) and exiting temperature above 70° F. (21° C.)) may in turn permit for relatively high cooling water temperatures (e.g., water entering a cooling coil around 68° F. (20° C.) and exiting around 104° F. (40° C.)) because the amount of heat that can be taken out of the air is generally proportional to the difference in temperature between the water and the air. If the difference can be kept at an acceptable level, where the temperatures are high enough that evaporative cooling (e.g., cooling through a cooling tower, without further cooling via chiller) is sufficient, the relatively high electrical cost of operating chiller 230 (or many chillers) may be avoided.

When the difference in temperatures is not very large, a change of only a few degrees can bring substantial gains in efficiency. For example, where the cooling water enters at 68° F. (20° C.), by heating air to 113° F. (45° C.) rather than 104° F. (40° C.), the temperature difference is increased from 68° F. to 77° F. (20° C. to 25° C.)—which may result in an increase in heat flow of 25 percent. The actual difference will vary slightly, as the entering conditions for air and water are not the only conditions (because the air cools as it passes through a cooling cool, and the water warms); this example, however, indicates how the difference in temperature can affect efficiency of a system.

Use of elevated temperatures in a system may also prevent air in or around the system from falling below its liquid saturation point, i.e., its dew point, and condensing. This may, in certain circumstances, provide benefits both in efficiency and in operations of the system. Efficiency benefits may be obtained because creating condensation requires much more energy than simply cooling air, so that systems creating condensation may use a large amount of electricity or other energy. Improvements in operations of the system may occur because, if pipes in the system carry water that is below the saturation temperature of the air around the pipes, condensation might form on the pipes. That condensation can damage the pipes or equipment in the conditioned space, cause mold, and cause water to pool on the floor, and can require the installation of insulation on the pipes (to stop the condensation).

In the system shown in FIG. 2, use of elevated temperatures may substantially reduce, or almost entirely eliminate, the need for energy-intensive cooling components such as chillers and the like, even where the heat load in the data center 201 is very high. As a result, system 200 may be operated at a lower operating cost than could otherwise be achieved. In addition, lower capital costs may be required, because fans, coils, heat exchangers, and cooling towers are relatively basic and inexpensive components. In addition, by operating with a higher temperature difference between cooled air and cooling water, less volume of cooling water is needed, thus reducing the size and cost of piping, and the cost to operate pumps and other such components.

In addition, those components are often very standardized, so that their acquisition costs are lower, and they are more easily located, particularly in developing countries and remote areas where it may be beneficial to place a data center 201. Use of system 200 in remote areas and other areas with limited access to electrical power is also helped by the fact that system 200 may be operated using less electrical power. As a result, such a system can be located near lower-power electrical sub-stations and the like. As discussed more completely below, lower-powered systems may also be amenable to being implemented as self-powered systems using energy sources such as solar, wind, natural-gas powered turbines, fuel cells, and the like.

Such temperatures may also be selected as a function of data center compute demand and corresponding electrical demand, as indicated in FIG. 1 by way of the setpoint adjustments provided by the central control system. For example, a master controller 244 may receive information from and provide commands to a compute load controller 246 and a facility load controller 248, which may control allocation of electrical power from a single common MV power plane to, respectively, (a) a computing system 240 that may include thousands of server systems in racks spread across the data center 201 along with networking equipment and other equipment that is needed in order to deliver the data services from the data center 201, and (b) a cooling system 242 that may include various ancillary equipment to serve the computing loads, such as to provide cooling because of heat generated by the computers and other equipment in the data center 201.

The master controller 244, compute load controller 246, and facility load controller 248 may operate in the manner described for the control system 102 in FIG. 1. For example, each of compute load controller 246 and facility load controller 248 may monitor its respective sub-system and determine approaching electrical loads for the sub-system. For example, the compute load controller 246 may identify an expected usage of electricity that will be needed in order to satisfy requests for computing needed in the data center 201. Such information may then be translated into a need for cooling to be provided by the cooling system 242. The facility load controller may take into account such information along with information about current and expected ambient conditions near the cooling equipment (e.g., where current conditions are sensed by a sensor array at or in the vicinity of the data center 201) to determine how much electricity will be needed to maintain a particular cooling level, such as to maintain a current or expected setpoint level for operating the data center 201. If electrical capacity is available, then load may be added to the system, both in terms of taking on additional computing tasks and in terms of adding to the amount that is cooled by the system. If the electrical capacity is not available, most or all of the remaining capacity may be assigned for a time to the computing load, which will cause temperatures in the data center 201 to rise. After a time, if the computing load falls so that there is again excess electrical capacity, then the capacity can be applied to the cooling system 242 so as to bring temperature more in line with a desired level. In making such allocation decisions for the power, the system 244 may take into account the susceptibility of the surrounding ambient air to provide cooling, so that the amount of electricity to provide a particular amount of cooling can be determined.

The data center 201 is shown here in sectional view as a building that houses a large number of computers or similar heat-generating electronic components (e.g., communications and networking components). A workspace 206 is defined around the computers, which are arranged in a number of parallel rows and mounted in vertical racks, such as racks 202a, 202b. The racks may include pairs of vertical rails to which are attached paired mounting brackets (not shown). Trays containing computers, such as standard circuit boards in the form of motherboards, may be placed on the mounting brackets.

In one example, the mounting brackets may be horizontal rails that are welded or otherwise adhered to vertical members in the frame of a rack, and trays may include motherboards that are slid into place on top of the brackets, similar to the manner in which food trays are slid onto storage racks in a cafeteria, or bread trays are slid into bread racks. The trays may be spaced closely together to maximize the number of trays in a data center, but sufficiently far apart to contain all the components on the trays and to permit air circulation between the trays. The fronts of the racks, where they are exposed to the workspace 206, may be left open and uncovered so as to allow air from the workspace 206 to flow readily over and between the trays of computers for purposes of cooling the computers and other equipment. Other arrangements may also be used. For example, trays may be mounted vertically in groups, such as in the form of computer blades. The trays may simply rest in a rack and be electrically connected after they are slid into place, or they may be provided with mechanisms, such as electrical traces along one edge, that create electrical and data connections when they are slid into place.

Air may circulate from workspace 206 across the trays and into warm-air plenums 204a, 204b behind the trays. The air may be drawn into the trays by fans mounted at the back of the trays (not shown). The fans may be programmed or otherwise configured to maintain a set exhaust temperature for the air into the warm air plenum, and may also be programmed or otherwise configured to maintain a particular temperature rise across the trays. Where the temperature of the air in the work space 206 is known, controlling the exhaust temperature also indirectly controls the temperature rise. The work space 206 may, in certain circumstances, be referenced as a "cold aisle," and the plenums 204a, 204b as "warm aisles." Although the warm aisles are shown here as being pressed against exterior walls of the data center 201, they may also be internal to the main area of the data center 201, such as by being between two rows of computer racks that are arranged back-to-back with the warm aisle between them.

The temperature rise can be relatively large. For example, the work space 206 temperature may be about 77° F. (25° C.) and the exhaust temperature into the warm-air plenums 204a, 204b may be set to 113° F. (45° C.), for a 36° F. (20° C.)) rise in temperature. The exhaust temperature may also be as much as 212° F. (100° C.) where the heat generating equipment can operate at such elevated temperature. For example, the temperature of the air exiting the equipment and entering the warm-air plenum may be 118.4, 122, 129.2, 136.4, 143.6, 150.8, 158, 165, 172.4, 179.6, 186.8, 194, 201, or 208.4° F. (48, 50, 54, 58, 62, 66, 70, 74, 78, 82, 86, 90, 94, or 98° C.). Such a high exhaust temperature generally runs contrary to teachings that cooling of heat-generating electronic equipment is best conducted by washing the equipment with large amounts of fast-moving, cool air. Such a cool-air approach does cool the equipment, but it also uses lots of energy.

Cooling of particular electronic equipment, such as microprocessors, may be improved even where the flow of air across the trays is slow, by attaching impingement fans to the tops of the microprocessors or other particularly warm components, or by providing heat pipes and related heat exchangers for such components.

The heated air may be routed upward into a ceiling area, or attic 105, or into a raised floor or basement, or other appropriate space, and may be gathered there by air handling units that include, for example, fan 210, which may include, for example, one or more centrifugal fans appropriately sized for the task. The fan 210 may then deliver the air back into a plenum 208 located adjacent to the workspace 206. The plenum 208 may be simply a bay-sized area in the middle of a row of racks, that has been left empty of racks, and that has been isolated from any warm-air plenums on either side of it, and from cold-air work space 206 on its other sides. Alternatively, air may be cooled by coils defining a border of warm-air plenums 204a, 204b and expelled directly into workspace 206, such as at the tops of warm-air plenums 204a, 204b.

Though shown as a recirculating air system here, some or all of the air that circulates through the server systems and into the attic space 205 may be exhausted. For example, the data center 201 may be arranged with a 100% fresh air system, where air may enter the data center from louvers in the exterior walls of the data center 201, and may exit through exhaust vents in or near the roof of the building. Alternatively, or in addition, the system 244 may operate to achieve free cooling when possible, so that when the ambient temperature is sufficiently below that needed to take up the load in the data center 201, 100% outdoor air may be circulated and exhausted immediately, whereas cooling water may begin to be circulated and the cooling coils used with recirculated air, when the ambient conditions are such that free cooling cannot keep up with the demand for cooling.

Cooling coils 212a, 212b may be located on opposed sides of the plenum approximately flush with the fronts of the racks. (The racks in the same row as the plenum 208, coming in and out of the page in the figure, are not shown.) The coils 212a, 212b may have a large face surface area and be very thin so as to present a low pressure drop to the fan 210. In this way, slower, smaller, and quieter fans may be used to drive air through the system. Protective structures such as louvers or wire mesh may be placed in front of the coils 212a, 212b to prevent them from being damaged by workers in the workspace 206.

In operation, fan 210 pushes air down into plenum 208, causing increased pressure in plenum 208 to push air out through cooling coils 212a, 212b. As the air passes through the coils 212a, 212b, its heat is transferred into the water in the coils 212a, 212b, and the air is cooled.

The speed of the fan 210 and/or the flow rate or temperature of cooling water flowing in the cooling coils 212a, 212b may be controlled by the control system 244 in response to measured values. For example, the pumps driving the cooling liquid may be variable speed pumps that are controlled to maintain a particular temperature in work space 206. Such control mechanisms may be used to maintain a constant temperature in workspace 206 or plenums 204a, 204b and attic 205.

The workspace 206 air may then be drawn into racks 202a, 202b such as by fans mounted on the many trays that are mounted in racks 202a, 202b. This air may be heated as it passes over the trays and through power supplies running the computers on the trays, and may then enter the warm-air plenums 204a, 204b. Each tray may have its own power supply and fan, with the power supply at the back edge of the tray, and the fan attached to the back of the power supply. All of the fans may be configured or programmed to deliver air at a single common temperature, such as at a set 113° F. (45° C.). The process may then be continuously readjusted as fan 210 captures and circulates the warm air.

Additional items may also be cooled using system 200. For example, room 216 is provided with a self-contained fan-coil unit 214 which contains a fan and a cooling coil. The unit 214 may operate, for example, in response to a thermostat provided in room 216. Room 216 may be, for example, an office or other workspace ancillary to the main portions of the data center 201.

In addition, supplemental cooling may also be provided to room 216 if necessary. For example, a standard roof-top or similar air-conditioning unit (not shown) may be installed to provide particular cooling needs on a spot basis. As one example, system 200 may be designed to deliver 78° F. (26° C.) supply air to work space 206, and workers may prefer to have an office in room 216 that is cooler. Thus, a dedicated air-conditioning unit may be provided for the office. This unit may be operated relatively efficiently, however, where its coverage is limited to a relatively small area of a building or a relatively small part of the heat load from a building. Also, cooling units, such as chillers, may provide for supplemental cooling, though their size may be reduced substantially compared to if they were used to provide substantial cooling for the system 200.

Fresh air may be provided to the workspace 206 by various mechanisms. For example, a supplemental air-conditioning unit (not shown), such as a standard roof-top unit may be provided to supply necessary exchanges of outside air. Also, such a unit may serve to dehumidify the workspace 206 for the limited latent loads in the system 200, such as human perspiration. Alternatively, louvers may be provided from the outside environment to the system 200, such as powered louvers to connect to the warm air plenum 204b. System 200 may be controlled to draw air through the plenums when environmental (outside) ambient humidity and temperature are sufficiently low to permit cooling with outside air. Such louvers may also be ducted to fan 210, and warm air in plenums 204a, 204b may simply be exhausted to atmosphere, so that the outside air does not mix with, and get diluted by, the warm air from the computers. Appropriate filtration may also be provided in the system, particularly where outside air is used.

Also, the workspace 206 may include heat loads other than the computers and other equipment in the trays, such as from people in the space and lighting. Where the volume of air passing through the various racks is very high and picks up a very large thermal load from multiple computers, the small additional load from other sources may be negligible, apart from perhaps a small latent heat load caused by workers, which may be removed by a smaller auxiliary air conditioning unit as described above.

Cooling water may be provided from a cooling water circuit powered by pump 224. The cooling water circuit may be formed as a direct-return, or indirect-return, circuit, and may generally be a closed-loop system. Pump 224 may take any appropriate form, such as a standard centrifugal pump. Heat exchanger 222 may remove heat from the cooling water in the circuit. Heat exchanger 222 may take any appropriate form, such as a plate-and-frame heat exchanger or a shell-and-tube heat exchanger.

Heat may be passed from the cooling water circuit to a condenser water circuit that includes heat exchanger 222, pump 220, and cooling tower 218. Pump 220 may also take any appropriate form, such as a centrifugal pump. Cooling tower 218 may be, for example, one or more forced draft towers or induced draft towers. The cooling tower 218 may be considered a free cooling source, because it requires power only for movement of the water in the system and in some implementations the powering of a fan to cause evaporation; it does not require operation of a compressor in a chiller or similar structure.

The cooling tower 218 may take a variety of forms, including as a hybrid cooling tower. Such a tower may combine both the evaporative cooling structures of a cooling tower with a water-to-water heat exchanger. As a result, such a tower may be fit in a smaller face and be operated more modularly than a standard cooling tower with separate heat exchanger. Additional advantage may be that hybrid towers may be run dry.

As shown, the fluid circuits may create an indirect water-side economizer arrangement (i.e., there is no need for active cooling equipment such as chillers, as opposed to simply cooling towers and related equipment). This arrangement may be relatively energy efficient, in that the only energy needed to power it is the energy for operating several pumps and fans. In addition, this system may be relatively inexpensive to implement, because pumps, fans, cooling towers, and heat exchangers are relatively technologically simple structures that are widely available in many forms. In addition, because the structures are relatively simple, repairs and maintenance may be less expensive and easier to complete. Such repairs may be possible without the need for technicians with highly specialized knowledge.

Alternatively, direct free cooling may be employed, such as by eliminating heat exchanger 222, and routing cooling tower water (condenser water) directly to cooling coils 212a, 212b (not shown). Such an implementation may be more efficient, as it removes one heat exchanging step. However, such an implementation also causes water from the cooling tower 218 to be introduced into what would otherwise be a closed system. As a result, the system in such an implementation may be filled with water that may contain bacteria, algae, and atmospheric contaminants, and may also be filled with other contaminants in the water. A hybrid tower, as discussed above, may provide similar benefits without the same detriments.

Control valve 226 is provided in the condenser water circuit to supply make-up water to the circuit. Make-up water may generally be needed because cooling tower 218 operates by evaporating large amounts of water from the circuit. The control valve 226 may be tied to a water level sensor in cooling tower 218, or to a basin shared by multiple cooling towers. When the water falls below a predetermined level, control valve 226 may be caused to open and supply additional makeup water to the circuit. A back-flow preventer (BFP) may also be provided in the make-up water line to prevent flow of water back from cooling tower 218 to a main water system, which may cause contamination of such a water system.

Optionally, a separate chiller circuit may be provided. Operation of system 200 may switch partially or entirely to this circuit during times of extreme atmospheric ambient (i.e., hot and humid) conditions or times of high heat load in the data center 201. Controlled mixing valves 234 are provided for electronically switching to the chiller circuit, or for blending cooling from the chiller circuit with cooling from the condenser circuit. Pump 228 may supply tower water to chiller 230, and pump 232 may supply chilled water, or cooling water, from chiller 230 to the remainder of system 200. Chiller 230 may take any appropriate form, such as a centrifugal, reciprocating, or screw chiller, or an absorption chiller.

The chiller circuit may be controlled to provide various appropriate temperatures for cooling water. In some implementations, the chilled water may be supplied exclusively to a cooling coil, while in others, the chilled water may be mixed, or blended, with water from heat exchanger 222, with common return water from a cooling coil to both structures. The chilled water may be supplied from chiller 230 at temperatures elevated from typical chilled water temperatures. For example, the chilled water may be supplied at temperatures of 55° F. (13° C.) to 65 to 70° F. (18 to 21° C.) or higher. The water may then be returned at temperatures like those discussed below, such as 59 to 176° F. (15 to 80° C.). In this approach that uses sources in addition to, or as an alternative to, free cooling, increases in the supply temperature of the chilled water can also result in substantial efficiency improvements for the system 200. Also, as noted, the system may supply electric power to the cooling equipment and the computing equipment from a common source of power (e.g., a single plane of MV power), and may control power allocated to each sub-system by taking into consideration the relative ability of the ambient conditions (e.g., current and/or future wet bulb temperature) to permit the cooling system to provide a particular level of additional cooling for a particular amount of electrical usage.

Pumps 220, 224, 228, 232, may be provided with variable speed drives. Such drives may be electronically controlled by a central control system to change the amount of water pumped by each pump in response to changing set points or changing conditions in the system 200. For example, pump 224 may be controlled to maintain a particular temperature in workspace 206, such as in response to signals from a thermostat or other sensor in workspace 206.

In operation, system 200 may respond to signals from various sensors placed in the system 200. The sensors may include, for example, thermostats, humidistats, flowmeters, and other similar sensors. In one implementation, one or more thermostats may be provided in warm air plenums 204a, 204b, and one or more thermostats may be placed in workspace 206. In addition, air pressure sensors may be located in workspace 206, and in warm air plenums 204a, 204b. The thermostats may be used to control the speed of associated pumps, so that if temperature begins to rise, the pumps turn faster to provide additional cooling waters.

Thermostats may also be used to control the speed of various items such as fan 210 to maintain a set pressure differential between two spaces, such as attic 205 and workspace 206, and to thereby maintain a consistent airflow rate. Where mechanisms for increasing cooling, such as speeding the operation of pumps, are no longer capable of keeping up with increasing loads, a control system may activate chiller 230 and associated pumps 228, 232, and may modulate control valves 234 accordingly to provide additional cooling. Moreover, as noted above, one or more sensors (e.g., monitored by the company that operates the data center 201 or by another company that shares its data) may be used to identify the ability of the cooling system to provide a particular amount of cooling for a particular amount of energy usage (e.g., via wet bulb temperature or another factor).

Various values for temperature of the fluids in system 200 may be used in the operation of system 200. In one exemplary implementation, the temperature setpoint in warm air plenums 204a, 204b may be selected to be at or near a maximum exit temperature for trays in racks 202a, 202b. This maximum temperature may be selected, for example, to be a known failure temperature or a maximum specified operating temperature for components in the trays, or may be a specified amount below such a known failure or specified operating temperature. In certain implementations, a temperature of 113° F. (45° C.) may be selected. In other implementations, temperatures of 77° F. (25° C.) to 257° F. (125° C.) may be selected. Higher temperatures may be particularly appropriate where alternative materials are used in the components of the computers in the data center, such as high temperature gate oxides and the like.

In one implementation, supply temperatures for cooling water may be 68° F. (20° C.), while return temperatures may be 104° F. (40° C.). In other implementations, temperatures of 50° F. to 84.20° F. or 104° F. (10° C. to 29° C. or 40° C.) may be selected for supply water, and 59° F. to 176° F. (15°

C. to 80° C.) for return water. Chilled water temperatures may be produced at much lower levels according to the specifications for the particular selected chiller. Cooling tower water supply temperatures may be generally slightly above the wet bulb temperature under ambient atmospheric conditions, while cooling tower return water temperatures will depend on the operation of the system 200.

Using these parameters and the parameters discussed above for entering and exiting air, relatively narrow approach temperatures may be achieved with the system 200. The approach temperature, in this example, is the difference in temperature between the air leaving a coil and the water entering a coil. The approach temperature will always be positive because the water entering the coil is the coldest water, and will start warming up as it travels through the coil. As a result, the water may be appreciably warmer by the time it exits the coil, and as a result, air passing through the coil near the water's exit point will be warmer than air passing through the coil at the water's entrance point. Because even the most-cooled exiting air, at the cooling water's entrance point, will be warmer than the entering water, the overall exiting air temperature will need to be at least somewhat warmer than the entering cooling water temperature.

Keeping the approach temperature small permits a system to be run on free, or evaporative, cooling for a larger portion of the year and reduces the size of a needed chiller, if any is needed at all. To lower the approach temperature, the cooling coils may be designed for counterflow rather than for self-draining. In counter-flow, the warmest air flows near the warmest water and the coolest air exits near where the coolest water enters.

In certain implementations, the entering water temperature may be 64° F. (18° C.) and the exiting air temperature 77° F. (25° C.), as noted above, for an approach temperature of 13° F. (7° C.). In other implementations, wider or narrower approach temperature may be selected based on economic considerations for an overall facility.

With a close approach temperature, the temperature of the cooled air exiting the coil will closely track the temperature of the cooling water entering the coil. As a result, the air temperature can be maintained, generally regardless of load, by maintaining a constant water temperature. In an evaporative cooling mode, a constant water temperature may be maintained as the wet bulb temperature stays constant (or changes very slowly), and by blending warmer return water with supply water as the wet bulb temperature falls. As such, active control of the cooling air temperature can be avoided in certain situations, and control may occur simply on the cooling water return and supply temperatures. The air temperature may also be used as a check on the water temperature, where the water temperature is the relevant control parameter.

Figure 3:
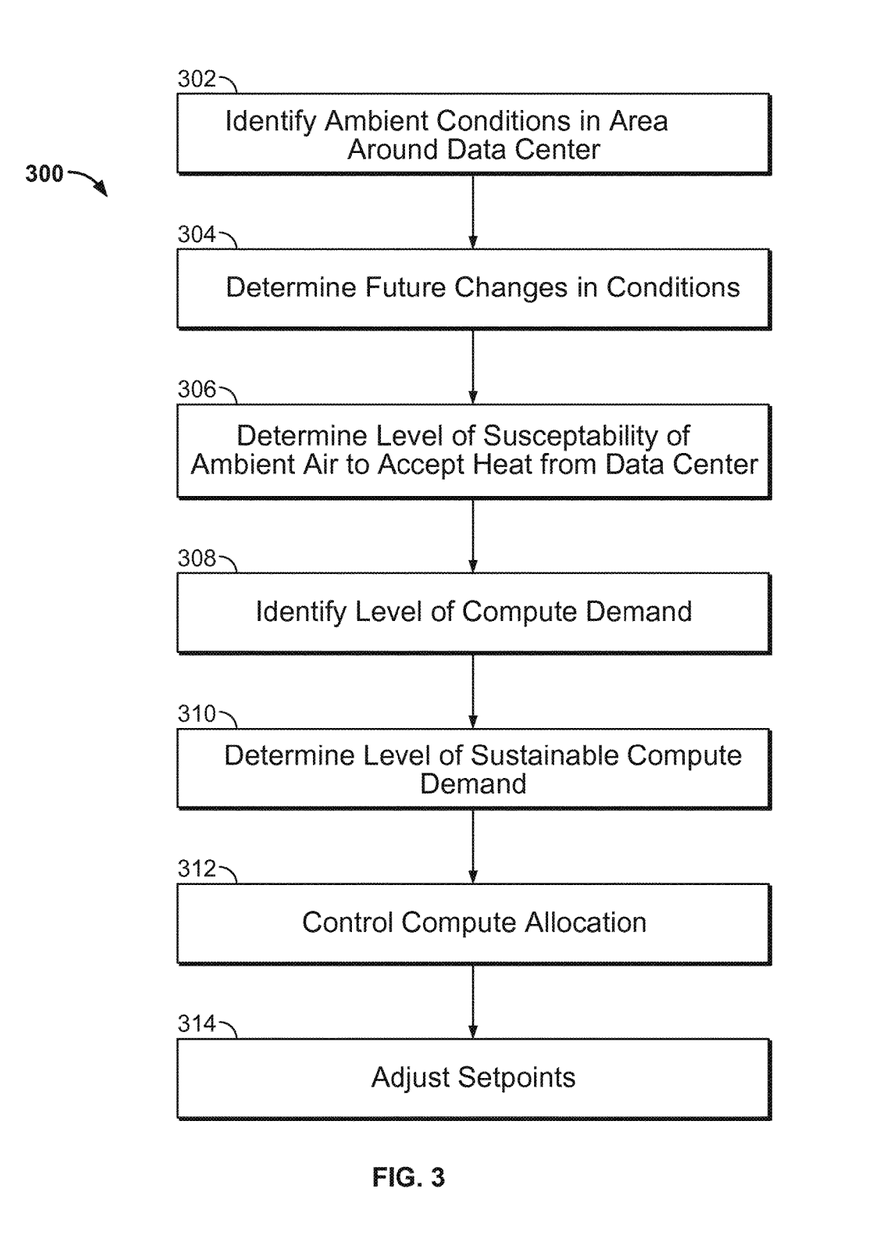
FIG. 3 is a flow chart showing steps for managing electric use and cooling in a data center.

FIG. 3 is a flow chart showing control of compute allocations based on current atmospheric conditions. In general, the process involves controlling the level of compute demand in a data center either directly or indirectly by controlling the level of electrical power available for use in the data center, as a function of measured environmental conditions around the data center, and in more particular, the ability of air around the data center to accept the load from the data center.

The process begins a box 302, where ambient conditions in an area around the data center are identified. For example, temperature and humidity, in the form of a wet bulb temperature reading or other appropriate readings, may be gathered by a system. Such readings in the implementations described here may occur effectively constantly, including a repeating rate faster than once per second, and the determinations of actions to take from such readings being performed more than once per second.

At block 304, future changes in environmental conditions are determined. Such an optional step may be used when the system is identifying longer-term needs for electrical and computing power, and the system's ability to provide such power without exceeding our allocations. For example, if a sudden cooling need is expected (e.g., because of an identified short-term need for increased computing tasks to be performed), the system may manage its load so as to take into account an identified ability of the atmospheric conditions to provide additional cooling for a particular "cost" in electrical usage by the cooling system. For example, if a wet bulb temperature is relatively low, the expected electrical demand needed to hit a particular setpoint temperature may be a lower amount than if the wet bulb temperature was higher. The wet bulb temperature may thus be used to determine an amount of electricity a cooling system will use in order to achieve or maintain the setpoint. The system may subsequently be controlled to maintain the setpoint, or alternatively to maintain a maximum electrical demand on the overall electrical system, at least for a period defined by the determination. The total amount of available electrical power for the coming period may thus be allocated according to the determination, to the computing portion of a data center load (critical loads) and the supporting portion of the load (essential loads).

As one example, the system may take on additional computing load, if the wet bulb temperature is relatively low and/or is expected to fall in the near future, that it might not otherwise take on if a sudden lowering in atmospheric temperature was not expected. Such decisions about future changes may be a function of inertia that is built into the system and that can be monitored and learned over time by a learning system that is part of a central management system like that described above.

Also, the operating of the cooling system may be a function of the electric demand that is being taken up by the critical loads at particular points in time, particularly when the system would be oversubscribed if the current needs of the computing load and the supporting load were satisfied. For example, if a system such as system 244 in FIG. 2 determines that the computing load needs a certain amount of electric power for a coming period and that such load would cause the system to exceed rating levels of total electric usage, the system 244 may provide commends to the supporting portion so that the electric usage by the supporting components rides down as the load commanded by the computing portion rides up, and vice-versa. Such may be achieved by the central system allocated certain amounts of power, and then each subsequent portion of the sub-system allocating smaller portions on down the line to the final components of the systems (e.g., computer servers for the computing load, and motors for the supporting load). Such an approach may cause the data center to temporarily run "hot," but will prevent electric design levels from being exceeded, while still bringing the data center back to a desired temperature as quickly as is practical.

At box 306, the process determines the level of susceptibility of the ambient air to accept heat from the data center. For example, the wet bulb temperature may be used to determine a level of heat that can be transferred out of the existing equipment serving the data center including equipment that may be added by demand, such as chillers or additional cooling towers. Such determination may be used in identifying the amount of electric energy that will be required by the system to achieve a particular cooling goal (e.g., to maintain or achieve a particular setpoint level).

The system may then, at box 308, determine a level of compute demand for the data center in the coming time period that matches an acceptable level of overall power usage for that period, when considering usage by the computer servers and by the cooling systems in addition to other systems in the data center. For example, a minimum level of electric usage to maintain a safe temperature level in the data center may be computed for the time period, and the remaining available electric availability may be provided for use by computers and related equipment. Such available electric usage may be used to determine the amount of computing (e.g., the number of discrete computing tasks) that the computers can perform in the period, and such amount of computing may be allocated to the computers in the data center.

At box 310, a level of sustainable compute demand is determined, which may be expressed in terms of a level of electrical demand that can be converted to a corresponding level of acceptable compute demand, or may be directly computed as a level of compute demand. For example, the system may determine that a particular number of MW of all electrical usage will generate a particular level of heat that needs to be removed by the cooling system. Such a level of electrical usage may thus be determined as an acceptable level if the acceptable level of cooling in light of the current atmospheric conditions is known.

At box 312, the compute allocations for the data center is computed as a function of the various inputs discussed here, including as a function of current susceptibility of the local environment to accept heat given off by the data center. Finally, at box 314, the set points for cooling in the data center may be adjusted. For example, from the determinations just discussed, the process may determine an amount of electric supply that will be available for performing cooling during a period. Using the ambient condition information, the system may determine a setpoint that can be maintained or achieved without exceeding such level of electric usage. The system may then be set to achieve such a setpoint. In similar manner, a system may be programmed to understand which components it may operate, and at which levels those components may be operated, to stay within a particular allotted electric usage. In such a situation, a look up table or similar mechanism can be provided with an allocated energy level as an input, and may identify values to which the system should be controlled (e.g., a certain number of pumps may be employed, and at certain determined load levels using variable speed controllers), so as to stay within the energy level.

Figure 4:
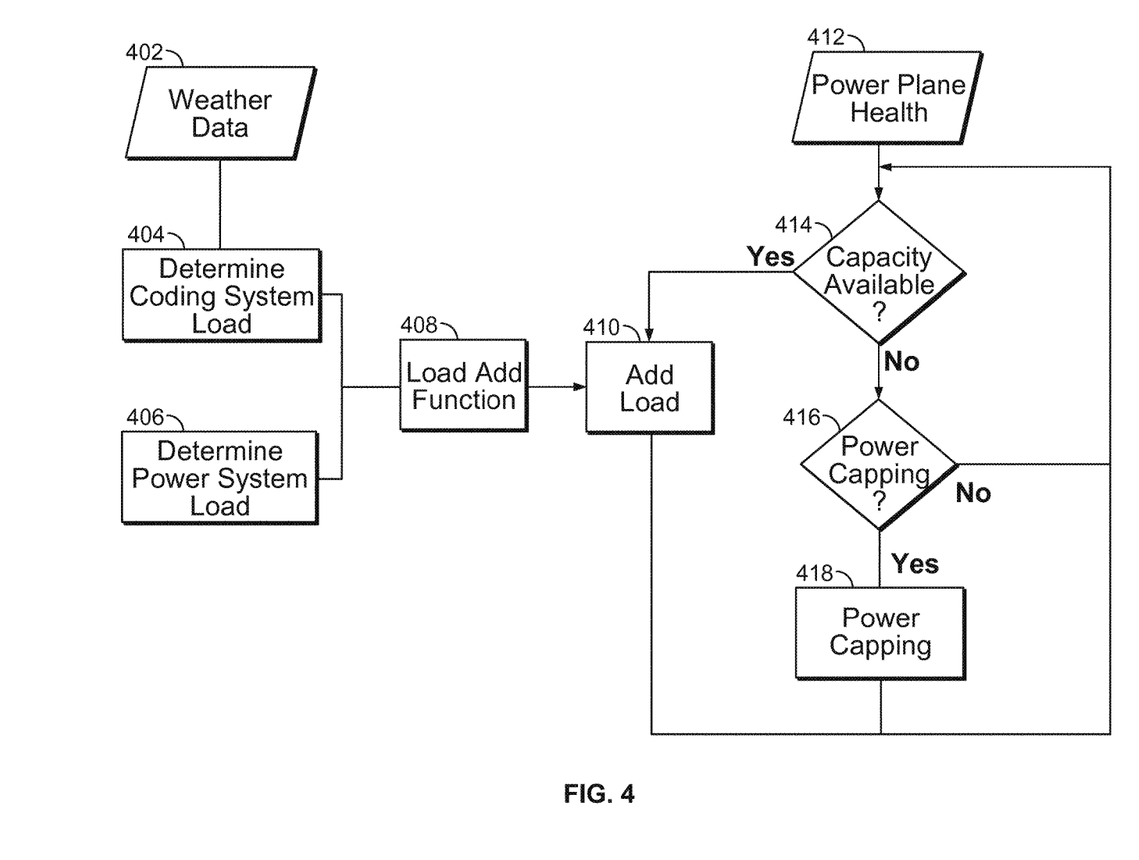
FIG. 4 is a flow chart showing control of compute allocations based on current atmospheric conditions.

FIG. 4 is a flow chart showing steps for managing electric use and cooling in a data center. In general, the flowchart shows actions that may be taken to change the load in terms of electrical power and computing activity that a data center system will take on as a function of environmental conditions around the data center. The flow chart is generally recursive, because it shows an ongoing process, where a control system (e.g., like that shown in FIGS. 1 and 2 above) takes into account changes in computing demand (with corresponding changes in cooling load caused by the computers) and changes in atmospheric conditions (e.g., as sensed by wet-bulb temperature) that affect the ability of a cooling system to provide a particular amount of cooling for a particular level of electric usage. These changes lead to the system changing the way the system is control, such as by changing allocations of computing capacity in a data center and changing control levels for a cooling system that supports the data center.

First, at box 402, weather data is identified by a cooling system load add function (box 404), which is considered in combination with a power system load add function (box 406) by a common load add function (408). The load add functions are programmed to determine if expected load needs to be added to a computing plant (IT, or critical, loads) and an associated cooling plant (essential loads). Such a determination may be made by first identifying expected demand for the cooling and power systems, such as in terms of BTUH, tons of chilling, or other units indicative of an amount of cooling, and then converting that load into a corresponding electric load that is expected to be needed.

The load add process can be proactive or reactive. It may be reactive, for example, when a central system indicates that more computer processing will need to be performed, and thus the system needs to react by determining whether it has electric capacity to take on the extra processing, both in terms of computer capacity (and electric capacity to operate the computers) and cooling capacity. The process may be proactive, for example, by the process identifying from weather that temperatures are falling or humidity is falling, so that the load add function may indicate that the data center can, and should, take on additional computing load. As a result, the process can directly identify additional computing load to take on or identify additional electrical load that can be taken on and that is used to determine that additional computing load can be taken on.

In the other branch of the flowchart, the power plane health is monitored (box 412), and it is determined whether additional power capacity is available in the system. In some aspects, for example, allocable power may be monitored as a power plane health variable. If additional capacity is available (box 414), load may be added (box 410) if the load add function indicates that the weather data and power system load can permit such additional load in the power system. If capacity is not available (box 414) a determination is made whether power capping is required and/or desired (box 416) based on the power plane health variable. If such power capping is required and/or desired, it may applied to maintain appropriate health for the power plane (box 418). For example, power capping may be implemented (box 418) based, at least in part, on a hierarchical ranking of computer jobs. For instance, a hierarchical importance value may be assigned to each computer job (or batch or set of jobs). Power capping may include killing one or more of the lowest rated jobs first in order to maintain appropriate health for the power plane, then killing one or more of the next lowest rated jobs in order to maintain appropriate health for the power plane, and so on. In some implementations, certain computer jobs (or batch or set of computer jobs) may be marked or valued so as to prevent their killing by power capping. If the appropriate health for the power plane cannot be maintained without killing such highly valued computer jobs, the system may take other measures to maintain appropriate health for the power plane.

If power capping is not required and/or desired, the process loops back to determining whether capacity is available. Such repeating of the process may occur, as discussed above, on a sub-second basis in appropriate implementations.

A number of embodiments have been described. For example, in one example implementation, a computer-implemented method for providing for conditioning of a computer data center includes identifying ambient conditions in an area around the computer data center; determining, with a computer system, a level of susceptibility for air around the computer data center to accept heat generated by the computer data center; and automatically adjusting, with the computer system, a level of power delivered to electronic equipment in the computer data center based on the determined level of susceptibility for the air around the computer data center to accept heat from the computer data center.

In a first aspect combinable with the general implementation, adjusting the level of power delivered to the electronic equipment includes allocating an amount of power available to the electronic equipment from a common power plane electrically coupled with data center facility equipment.

In a second aspect combinable with any of the previous aspects, adjusting the level of power delivered to the electronic equipment includes adjusting a number of computing operations that can be assigned to computer servers in the computer data center over a particular time period.

In a third aspect combinable with any of the previous aspects, the adjustment is performed by a central system that controls assignment of tasks to substantially all the computers in the computer data center.

In a fourth aspect combinable with any of the previous aspects, the level of susceptibility for the air around the computer data to accept heat from the computer data center is determined by sensing wet bulb temperature and dry bulb temperature of the air around the computer data center.

In a fifth aspect combinable with any of the previous aspects, automatically adjusting the level of power delivered to electronic equipment in the computer data center includes identifying an expected demand for computing resources and determining whether the expected demand can be met without exceeding a determined power allocation for information technology (IT) equipment.

In a sixth aspect combinable with any of the previous aspects, herein automatically adjusting the level of power delivered to electronic equipment in the computer data center includes determining that an allocated level of power delivery to the IT equipment will cause cooling setpoints to be exceeded for the data center; and determining a time period for which the allocated level of power delivery to the IT equipment will be allowed to exceed a cooling level of a cooling system for the data center.

In a seventh aspect combinable with any of the previous aspects, automatically adjusting the level of power delivered to electronic equipment in the computer data center includes determining a predicted electric power level required by a cooling system for the data center to produce a determined cooling level as a function of the identified ambient conditions.

In an eighth aspect combinable with any of the previous aspects, determining a level of susceptibility for air around the computer data center to accept heat generated by the computer data center includes identifying ambient conditions for a future period around the data center by accessing weather forecasting information.

A ninth aspect combinable with any of the previous aspects further includes determining a schedule for information technology (IT) equipment use over a first period and a schedule for cooling equipment use over a second period that corresponds to the first period, wherein the schedule for IT equipment use is determined so as to offset heat loads generated by the IT equipment over the first period.

In a tenth aspect combinable with any of the previous aspects, the first period is the same as the second period.

In another general implementation, a system for providing cooled air to electronic equipment includes a cooling system arranged to provide cooling for computer systems in a data center that generate heat from electrical usage; one or more electronic sensors for sensing an environmental condition near the data center; and a central computer control system programmed to allocate future compute demand for the data center as a function of the sensed environmental condition.

A first aspect combinable with the general implementation further includes a common power domain electrically coupled to the cooling system and the computer systems.

In a second aspect combinable with any of the previous aspects, the common domain plane includes a medium power domain.

In a third aspect combinable with any of the previous aspects, the medium power domain is configured to provide power freely without substantial interference by devices in the medium power domain.

In a fourth aspect combinable with any of the previous aspects, the medium power domain is about 10 MW to about 100 MW in size, and serves about one half or more of the data center.

In a fifth aspect combinable with any of the previous aspects, the sensed environmental condition includes wet bulb temperature.

In a sixth aspect combinable with any of the previous aspects, the central control system allocates future compute demand as a function of a determine level of susceptibility of an outdoor area around the data center to accept heat from the data center.

In a seventh aspect combinable with any of the previous aspects, the control system allocates future compute demand by allocating future electrical usage in the data center, and further including electrical distribution devices that are programmed to receive information about electrical allocation from the central control system and to inform particular computer in the data center regarding their allocated compute demand.

In an eighth aspect combinable with any of the previous aspects, the control system identifies a total level of allocable power and selects a level of allocation for information technology resources in the data center and cooling systems that provide cooling to the data center.

In a ninth aspect combinable with any of the previous aspects, the central computer system is further programmed to cause the cooling system to match, in cooling provided, heat that is generated in the data center.

In a tenth aspect combinable with any of the previous aspects, the central computer control system is programmed to identify a level of electric demand that will be required by the cooling system as a function of (a) expected computing work that will be performed by computers in the data center and (b) the sensed environmental condition.

In another general implementation, a system for providing cooled air to electronic equipment includes a cooling system arranged to provide cooling for computer systems in a data center that generate heat from electrical usage; one or more electronic sensors for sensing an environmental condition near the data center; and means for using information about the sensed environmental condition to allocate an amount of computer processing that information technology (IT) resources in the data center will take on.

In a first aspect combinable with the general implementation, the means for using information about the sensed environmental condition to allocate an amount of computer processing allocates future compute demand as a function of a determine level of susceptibility of an outdoor area around the data center to accept heat from the data center.

A second aspect combinable with any of the previous aspects further includes a single common medium power domain at the data center in which electrical power can flow freely without substantial interference by devices in the medium power domain, wherein the medium power domain is about 10 MW to about 100 MW in size, and serves about one half or more of the data center.

A number of embodiments have been described. Nevertheless, it will be understood that various modifications may be made without departing from the spirit and scope of what is described. For example, the steps of the exemplary flow chart on FIGS. 3 and 4 may be performed in other orders, some steps may be removed, and other steps may be added. Accordingly, other embodiments are within the scope of the following claims.

What is claimed is:

1. A computer-implemented method for providing for conditioning of a computer data center, the method comprising:
   identifying outdoor ambient conditions in an outdoor area around the computer data center;
   determining, with a computer system, a level of susceptibility for air outside of the computer data center to accept heat generated by the computer data center; and
   automatically adjusting, with the computer system, a level of power delivered to electronic equipment in the computer data center based on the determined level of susceptibility for the air outside of the computer data center to accept heat from the computer data center, wherein automatically adjusting the level of power delivered to the electronic equipment in the computer data center comprises:
      identifying an expected demand for computing resources and determining that the expected demand can be met without exceeding a determined power allocation for the electronic equipment;
      determining that an allocated level of power delivery to the electronic equipment will cause cooling setpoints to be exceeded for the computer data center; and
      determining a time period for which the allocated level of power delivery to the electronic equipment will be allowed to exceed a cooling level of a cooling system for the computer data center.

2. The computer-implemented method of claim 1, wherein adjusting the level of power delivered to the electronic equipment comprises allocating an amount of power available to the electronic equipment from a common power plane electrically coupled with data center facility equipment.

3. The computer-implemented method of claim 1, wherein adjusting the level of power delivered to the electronic equipment comprises adjusting a number of computing operations that can be assigned to computer servers in the computer data center over a particular time period.

4. The computer-implemented method of claim 3, wherein the adjustment is performed by a central system that controls assignment of tasks to all the computers in the computer data center.

5. The computer-implemented method of claim 1, wherein the level of susceptibility for the air outside of the computer data to accept heat from the computer data center is determined by sensing wet bulb temperature and dry bulb temperature of the air outside of the computer data center.

6. The computer-implemented method of claim 1, wherein automatically adjusting the level of power delivered to electronic equipment in the computer data center comprises determining a predicted electric power level required by a cooling system for the data center to produce a determined cooling level as a function of the identified outdoor ambient conditions.

7. The computer-implemented method of claim 1, where determining a level of susceptibility for the air outside of the computer data center to accept heat generated by the computer data center comprises identifying outdoor ambient conditions for a future period around the data center by accessing weather forecasting information.

8. The computer-implemented method of claim 7, further comprising determining a schedule for the electronic equipment use over a first period and a schedule for cooling equipment use over a second period that corresponds to the first period, wherein the schedule for the electronic equipment use is determined so as to offset heat loads generated by the electronic equipment over the first period.

9. The computer-implemented method of claim 8, wherein the first period is the same as the second period.

10. A system for providing cooled air to electronic equipment, comprising:
    a cooling system arranged to provide cooling for computer systems in a data center that generate heat from electrical usage;
    one or more electronic sensors for sensing an outdoor environmental condition near the data center; and
    a central computer control system programmed to allocate future compute demand for the data center as a function of the sensed outdoor environmental condition, the central computer control system further programmed to automatically adjust a level of power delivered to the computer systems in the data center by:
       identifying an expected demand for computing resources and determining that the expected demand can be met without exceeding a determined power allocation for the computer systems;
       determining that an allocated level of power delivery to the computer systems will cause cooling setpoints of the cooling system to be exceeded for the data center; and
       determining a time period for which the allocated level of power delivery to the computer systems will be allowed to exceed a cooling level of the cooling system for the data center.

11. The system of claim 10, further comprising a common power domain electrically coupled to the cooling system and the computer systems.

12. The system of claim 11, wherein the common domain plane comprises a medium power domain.

13. The system of claim 12, wherein the medium power domain is configured to provide power freely without interference by devices in the medium power domain.

14. The system of claim 13, wherein the medium power domain is about 10 MW to about 100 MW in size, and serves about one half or more of the data center.

15. The system of claim 10, wherein the sensed outdoor environmental condition comprises wet bulb temperature.

16. The system of claim 10, wherein the central control system allocates future compute demand as a function of a determine level of susceptibility of an outdoor area around the data center to accept heat from the data center.

17. The system of claim 10, wherein the control system allocates future compute demand by allocating future electrical usage in the data center, and further comprising electrical distribution devices that are programmed to receive information about electrical allocation from the central control system and to inform particular computer in the data center regarding their allocated compute demand.

18. The system of claim 17, wherein the control system identifies a total level of allocable power and selects a level of allocation for information technology resources in the data center and cooling systems that provide cooling to the data center.

19. The system of claim 10, wherein the central computer system is further programmed to cause the cooling system to match, in cooling provided, heat that is generated in the data center.

20. The system of claim 10, wherein the central computer control system is programmed to identify a level of electric demand that will be required by the cooling system as a function of (a) expected computing work that will be performed by computers in the data center and (b) the sensed outdoor environmental condition.

21. A system for providing cooled air to electronic equipment, comprising:
  a cooling system arranged to provide cooling for computer systems in a data center that generate heat from electrical usage;
  one or more electronic sensors for sensing an outdoor environmental condition near the data center;
  means for using information about the sensed outdoor environmental condition to allocate an amount of computer processing that information technology (IT) resources in the data center will take on; and
  means for automatically adjusting the level of power delivered to the IT resources in the data center by:
    identifying an expected demand for computing resources and determining that the expected demand can be met without exceeding a determined power allocation for the IT resources;
    determining that an allocated level of power delivery to the IT resources will cause cooling setpoints to be exceeded for the computer data center; and
    determining a time period for which the allocated level of power delivery to the IT resources will be allowed to exceed a cooling level of a cooling system for the computer data center.

22. The system of claim 21, wherein the means for using information about the sensed outdoor environmental condition to allocate an amount of computer processing allocates future compute demand as a function of a determine level of susceptibility of an outdoor area around the data center to accept heat from the data center.

23. The system of claim 21, further comprising a single common medium power domain at the data center in which electrical power can flow freely without interference by devices in the medium power domain, wherein the medium power domain is about 10 MW to about 100 MW in size, and serves about one half or more of the data center.

* * * * *